US007915641B2

(12) United States Patent
Otsuji et al.

(10) Patent No.: US 7,915,641 B2
(45) Date of Patent: Mar. 29, 2011

(54) TERAHERTZ ELECTROMAGNETIC WAVE RADIATION ELEMENT AND ITS MANUFACTURING METHOD

(75) Inventors: Taiichi Otsuji, Kitakyushu (JP); Eiichi Sano, Sapporo (JP)

(73) Assignees: Kyushu Institute of Technology, Fukuoka (JP); National University Corporation Hokkaido University, Hokkaido (JP)

( * ) Notice: Subject to any disclaimer, the term of this patent is extended or adjusted under 35 U.S.C. 154(b) by 1050 days.

(21) Appl. No.: 11/575,102

(22) PCT Filed: Aug. 23, 2005

(86) PCT No.: PCT/JP2005/015277
§ 371 (c)(1),
(2), (4) Date: Mar. 12, 2007

(87) PCT Pub. No.: WO2006/030608
PCT Pub. Date: Mar. 23, 2006

(65) Prior Publication Data
US 2008/0315216 A1      Dec. 25, 2008

(30) Foreign Application Priority Data

Sep. 13, 2004   (JP) ................................. 2004-265011

(51) Int. Cl.
  *H01L 33/00*    (2010.01)
  *H01L 31/00*    (2010.01)
  *H01L 21/00*    (2010.01)
(52) U.S. Cl. ............ 257/192; 257/10; 257/21; 257/202; 257/E31.001; 257/E33.001; 438/24; 438/128; 438/285; 438/587; 438/590
(58) Field of Classification Search .................... 257/10, 257/21, 83, 192, 202, E31.001, E33.001; 438/128, 285, 587, 590, 598
See application file for complete search history.

(56) References Cited

U.S. PATENT DOCUMENTS
7,376,403 B1 *    5/2008   Wanke et al. .............. 455/189.1
(Continued)

OTHER PUBLICATIONS

Mitsuhiro Hanabe et al., Proceedings of SPIE, Microwave and Terahertz Photonics vol. 5466 (2004) p. 218-225, Apr. 29, 2004.

(Continued)

*Primary Examiner* — Hung Vu
*Assistant Examiner* — Vernon P Webb
(74) *Attorney, Agent, or Firm* — McGlew and Tuttle, P.C.

(57) ABSTRACT

The present invention improves the efficiency of conversion from a non-radiation two-dimensional electron plasmon wave into a radiation electromagnetic wave, and realizes a wide-band characteristic. A terahertz electromagnetic wave radiation element of the present invention comprises a semi-insulating semiconductor bulk layer, a two-dimensional electron layer formed directly above the semiconductor bulk layer by a semiconductor heterojunction structure, source and drain electrodes electrically connected to two opposed sides of the two-dimensional electron layer, a double gate electrode grating which is provided in the vicinity of and parallel to the upper surface of the two-dimensional electron layer and for which two different dc bias potentials can be alternately set, and a transparent metal mirror provided in contact with the lower surface of the semiconductor bulk layer, formed into a film shape, functioning as a reflecting mirror in the terahertz band, and being transparent in the light wave band. Two light waves are caused to enter from the lower surface of the transparent metal mirror, and two different dc bias potentials are alternately applied to the double gate electrode grating so as to periodically modulate the electron density of the two-dimensional electron layer in accordance with the configuration of the double gate electrode grating.

11 Claims, 5 Drawing Sheets

U.S. PATENT DOCUMENTS

2004/0201076 A1* 10/2004 Shur et al. .................. 257/462
2005/0093023 A1* 5/2005 Raspopin et al. ............. 257/202

OTHER PUBLICATIONS

Tamotsu Hashizume et al., Japanese Journal of Applied Physics vol. 43, No. 6B (2004) Part 2Letters & Express Letters, p. L777-L779, Jun. 14, 2004.

R. J. Wilkinson et al., Journal of Applied Physics vol. 71, No. 12 (1992) p. 6049-6061, Jun. 15, 1992.

Shin'ichi Katayama et al., Solid-State Electronics vol. 42, No. 7-8 (1998) p. 1561-1564, Jul. 1998.

V. Ryzhii et al., Journal of Applied Physics vol. 91, No. 4 (2002) p. 1875-1881, Feb. 15, 2002.

S. A. Mikhailov et al., Physical Review B vol. 58, No. 3 (1998) p. 1517-1532, Jul. 15, 1998.

M. Dyakonov and M. Shur, Phys. Rev. Lett., 71 (15), 2465 (1993).

T. Otsuji, Y. Kanamaru, et al., Dig. the 59th Annual Dev. Res. Conf. Notre Dame, IN, 97 (2001).

X.G. Peralta, et al., Applied Physics Letters, vol. 81, No. 9, pp. 1627-1629, (2002).

Otsuji T. et al., A novel terahertz plasma-wave photomixer with resonant-cavity enhanced structure, IEEE, Sep. 27, 2004, pp. 331-332, XP010796839, Piscataway, NJ, USA.

Ryzhii V. et al, Plasma mechanism of terahertz photomixing in high-electron mobility transistor under interband photoexcitation, Journal of Applied Physics, Nov. 15, 2002, pp. 5756-5760, vol. 92, No. 10, American Institute of Physics, New York, US.

Kkatayama S et al., Far-infrared emission spectra from hot two-dimensional plasma in hterojunctions, Solid State Electronics, Jul. 8, 1998, pp. 1561-1564, vol. 42, No. 7-8, Elsevier Science Publishers, Barking, Great Britain.

Satou et al., Characteristics of a terahertz photomixer based on a high-electron mobility transistor structure with optical input through the ungated regions, Journal of Applied Physics, Feb. 15, 2004, pp. 2084-2089, vol. 95, No. 4, American Institute of Physics, New York, US.

* cited by examiner

TERAHERTZ ELECTROMAGNETIC WAVE RADIATION ELEMENT AND ITS MANUFACTURING METHOD

TECHNICAL FIELD

The present invention relates to a terahertz electromagnetic wave radiation element which receives two coherent light waves, mixes them, and radiates a terahertz electromagnetic wave corresponding to the difference frequency thereof, and to a method of manufacturing the same.

BACKGROUND ART

A two-dimensional electron system is coherently polarized and vibrationally excited by means of an optical phonon or photon corresponding to inter-sub-band energy. This vibrational quantum is called two-dimensional electron plasmon. At a typical two-dimensional electron density ($10^{11}$ to $10^{12}$ cm$^{-2}$), the two-dimensional electron plasmon is of a wavelength range of micron to submicron, and the basic mode frequency reaches the terahertz band. Therefore, the two-dimensional electron plasmon has a capability of serving as a mechanism for realizing functions of electromagnetic wave oscillation, electromagnetic wave detection, frequency mixing, frequency multiplication, etc. in the terahertz band. Studies on the physical properties of the two-dimensional electron plasmon were started in the early 1970's. Studies on application to terahertz devices were started in the 1990's; the history is still short, and practical elements have not yet been developed.

M. Dyakonov and M. Shur proposed a terahertz band application of two-dimensional electron plasmon in a high electron mobility transistor (HEMT) structure (see Non-Patent Document 1). Since electron density, which determines the plasmon resonance frequency, can be controlled by means of gate bias, a frequency-variable characteristic which is of practical importance can be realized. The boundary conditions of the source and drain can be made asymmetric by means of a difference in bias dependency between the gate-source capacitance and the gate-drain capacitance. A radiation mode electromagnetic wave can be taken out at the drain open end. An odd-order harmonic component can be taken out from the drain end, and an even-order harmonic component can be taken out from the vicinity of the center of the channel. Therefore, when the density of two-dimensional electrons is modulated by the frequency difference terahertz component of photoconductive electrons generated through interband excitation by two light wave photons, plasmon resonance in the terahertz band can be induced (see Non-Patent Documents 2 and 3). This two-dimensional electron plasmon resonance wave is of a non-radiation mode, and cannot be radiated to the outside. However, through provision of a metal grating or antenna structure in the vicinity of the two-dimensional electron plasmon, the terahertz-band two-dimensional electron plasmon vibration of the non-radiation mode can be converted to a radiation mode electromagnetic wave (see Non-Patent Documents 3 and 4). Thus, a terahertz-band photo mixer utilizing the two-dimensional electron plasmon can be realized.

When a photo mixer is configured, the following two points are important.
(1) The efficiency of conversion from light waves to two-dimensional electron plasmon resonance.
(2) The efficiency of conversion from two-dimensional electron plasmon resonance to radiation electromagnetic waves.

Of these, the efficiency of conversion from two-dimensional electron plasmon resonance to radiation electromagnetic waves mentioned in (2) above, which is the object of consideration in the present invention, will be described from the viewpoint of progress in conventional techniques.

A grating coupler has been introduced as a mode conversion mechanism for converting a two-dimensional electron plasmon resonance wave of the non-radiation mode to a radiation mode electromagnetic wave. This is well known as the so-called Smith-Purcel effect.

As disclosed in Non-Patent Document 5, R. J. Wilkinson, et. al. formed the gate electrode in the shape of a nested double grating, periodically modulated the density of two-dimensional electrons, and observed far-infrared-light transmission and reflection characteristics. They asserted that the grating structure formed by means of two-dimensional electron density modulation functions as a photo coupler which efficiently absorbs far-infrared light, and the plasma resonance frequency can be controlled by means of two-dimensional electron density modulation.

In Non-Patent Document 4, S. A. Mikhailov explains electromagnetic-wave propagation characteristics by making use of the structural parameters of this grating structure, and physical property parameters of the material, including density of two-dimensional electrons, electron density at the grating portion, drift speed of electrons, and scattering relaxation time. He also showed that when the plasma frequency determined as a result of the density of two-dimensional electrons being periodically modulated by the grating becomes equal to the plasma frequency of the grating itself; if the degree of scattering of electrons is low, the transmission coefficient of electromagnetic waves exceeds 1 in a range in the vicinity of and lower than the plasma frequency, and an amplification gain can be obtained. As a specific measure, there was proposed to introduce, in place of a metal grating, a quantum wire whose conductivity is as low as that of the two-dimensional electron plasmon.

As described in Non-Patent Document 6, X. G. Peralta, et. al. formed two two-dimensional electron layers, periodically modulated the density of two-dimensional electrons of the upper layer by means of a single-grating-type gate, and observed the characteristic of optical response of the two-dimensional electron layers to radiation of terahertz electromagnetic waves. They showed that the resonance property which influences the optical response characteristic at the plasma frequency determined as a result of subjection to periodical density modulation is enhanced through provision of two two-dimensional electron layers.

Another example of instruction of a grating structure for mode conversion is introduction of a spiral antenna structure which was proposed by V. Ryzhii, et. al. in Non-Patent Document 3.

Non-Patent Document 1: M. Dyakonov and M. Shur, Phys. Rev. Lett., 71(15), 2465 (1993)
Non-Patent Document 2: T. Otsuji, Y. Kanamaru, et. al., Dig. the 59th Annual Dev. Res. Conf., Notre Dame, Ind., 97(2001)
Non-Patent Document 3: V. Ryzhii, I. Khmyrova, and M. Shur, J. Appl. Phys., Vol. 91, No. 4, 1875 (2002)
Non-Patent Document 4: S. A. Mikhailov, Phys. Rev. B, Vol. 58, pp. 1517-1532, 1998
Non-Patent Document 5: R. J. Wilkinson, et. al., Journal of Applied Physics, Vol. 71, No. 12, pp. 6049-6061, 1992
Non-Patent Document 6: X. G. Peralta, et. al., Applied Physics Letters, Vol. 81, No. 9, pp. 1627-1629, 2002

DISCLOSURE OF THE INVENTION

Problems to be Solved by the Invention

As described above, studies were conducted on the plasmon resonance of grating-coupled two-dimensional electron plasmon. However, the efficiency of conversion from plasmon resonance to terahertz electromagnetic wave radiation is low, and a large barrier exists against practical use as a photo mixer. Further, the periodicity of the grating inevitably causes frequency selectivity, and realization of wide-band mode conversion is intrinsically impossible.

An object of the present invention is to overcome the problems of the above-described conventional techniques, and to increase the efficiency of conversion from non-radiation two-dimensional electron plasmon wave to radiation electromagnetic waves and realize a wide band characteristic.

Means for Solving the Problems

A terahertz electromagnetic wave radiation element of the present invention receives two coherent light waves, mixes them, and radiates a terahertz electromagnetic wave corresponding to the difference frequency thereof. This terahertz electromagnetic wave radiation element comprises a semiinsulating semiconductor bulk layer; a two-dimensional electron layer formed directly above the semiconductor bulk layer by a semiconductor heterojunction structure; a source electrode electrically connected to one side of the two-dimensional electron layer; a drain electrode electrically connected to another side of the two-dimensional electron layer opposite to the source electrode; a double gate electrode grating provided in the vicinity of an upper surface of the two-dimensional electron layer and parallel to the two-dimensional electron layer, two different dc bias potentials being able to be alternately set for the double gate electrode grating; and a transparent metal mirror provided in contact with a lower surface of the semiconductor bulk layer, formed into a film shape, functioning as a reflecting mirror in the terahertz band, and being transparent in the light wave band. Two light waves are caused to enter from a lower surface of the transparent metal mirror, and two different dc bias potentials are alternately applied to the double gate electrode grating so as to periodically modulate the electron density in the two-dimensional electron layer in accordance with the configuration of the double gate electrode grating.

A method of manufacturing a terahertz electromagnetic wave radiation element according to the present invention comprises forming a two-dimensional electron layer formed directly above a substrate serving as a semiconductor bulk layer by a semiconductor heterojunction structure, a source electrode electrically connected to one side of the two-dimensional electron layer, and a drain electrode electrically connected to another side of the two-dimensional electron layer opposite to the source electrode; forming a double gate electrode grating in the vicinity of an upper surface of the two-dimensional electron layer and parallel to the two-dimensional electron layer, two different dc bias potentials being able to be alternately set for the double gate electrode grating; and forming a transparent metal mirror in contact with a lower surface of the semiconductor bulk layer, the metal mirror being formed into a film shape, functioning as a reflecting mirror in the terahertz band, and being transparent in the light wave band.

Effects of the Invention

According to the present invention, the efficiency of conversion from non-radiation two-dimensional electron plasmon wave to radiation electromagnetic wave can be improved, and a wider band characteristic can be realized.

BEST MODE FOR CARRYING OUT THE INVENTION

Figure 1:
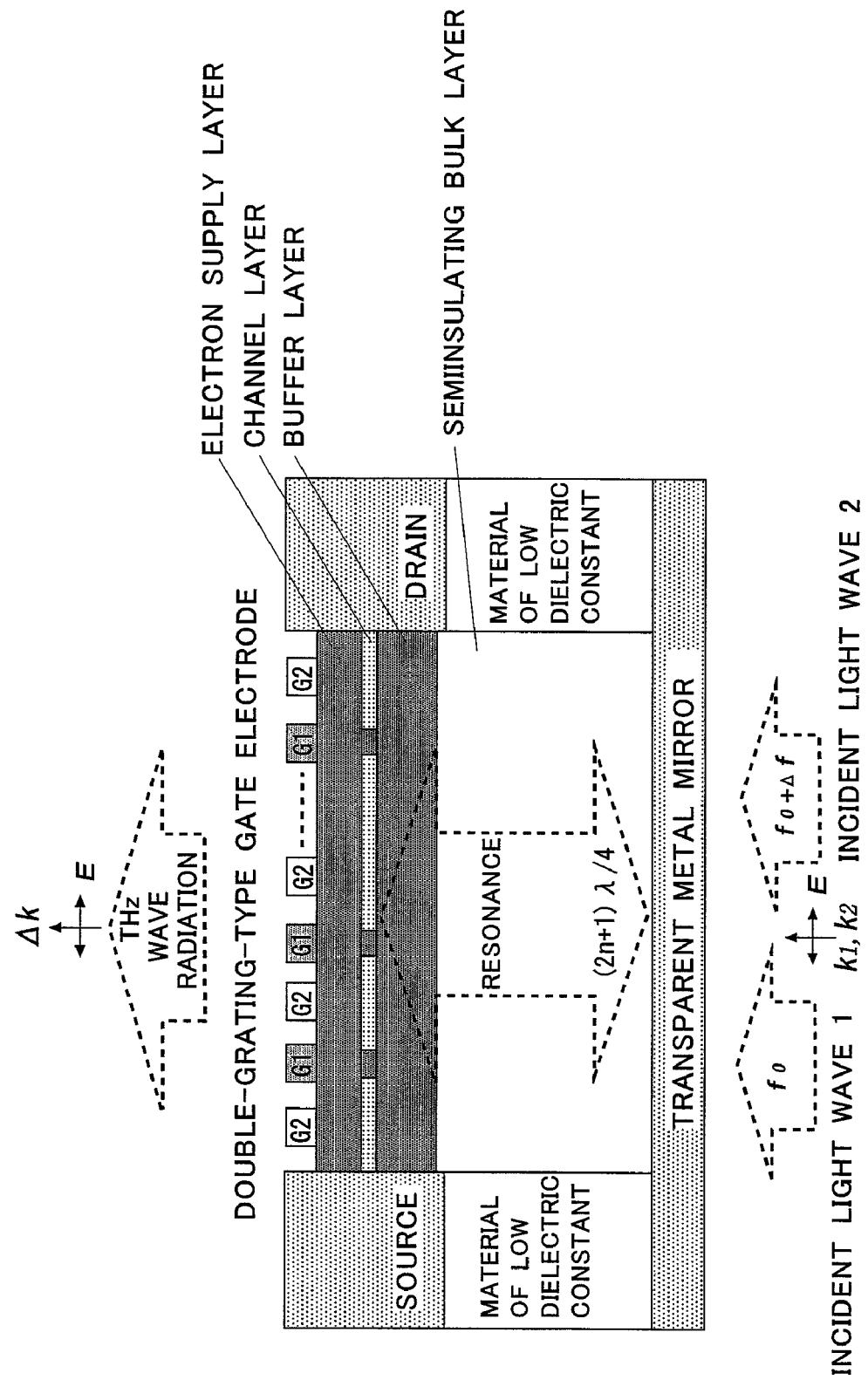
FIG. 1 is a cross sectional view showing a first example structure of a terahertz electromagnetic wave radiation element which embodies the present invention.

The present invention will next be described on the basis of examples. FIG. 1 is a cross sectional view showing a first example structure of a terahertz electromagnetic wave radiation element which embodies the present invention. As shown in the drawing, a semiconductor heterojunction structure is formed on a substrate that constitutes a semiinsulating bulk layer. The semiconductor heterojunction structure is composed of a wide-band-gap buffer layer, a narrow-band-gap channel layer formed of an intrinsic semiconductor, and a wide-band-gap electron supply layer (carrier supply layer) in which a donor is doped two-dimensionally. The semiconductor heterojunction structure can be formed on the semiinsulating bulk layer through epitaxial growth with an accuracy on the nanometer level, by means of a technique of molecular beam epitaxy (MBE) or metal-organic vapor phase epitaxy (MOVPE), which have been practically used for mass production of compound transistors.

The buffer layer, the channel layer, and the electron supply layer cooperate to confine electrons two-dimensionally at the channel-side boundary between the channel layer and the electron supply layer to thereby form a two-dimensional electron layer. A strongly doped n-type semiconductor epitaxial layer is deposited on the electron supply layer as an ohmic layer. Metal electrodes are further formed at opposite end portions of the channel through film formation, whereby the metal electrodes and the channel layer are ohmic-connected, and thus source and drain electrodes are formed. Meanwhile, the ohmic layer above the channel is removed through recess etching, and a gate electrode is formed. The process up to this point is identical with a process typically used for manufacture of HEMT elements.

The gate electrode is etched into a comb-like shape, teeth in odd positions are connected together at the outside of the channel, and teeth in even positions are connected together at the outside of the channel, thereby forming two gate electrode gratings (for facilitating description, they will be referred to as "gate gratings A and B") assuming a nested double grating structure. By means of maintaining the gate gratings A and B at different bias potentials, the electron density of the two-dimensional electron layer immediately below the gate gratings can be modulated at the cycle of the gate gratings.

The double grating gate is desirably formed of a semi-metal having low conductivity, such as molybdenum. This is because the plasma frequency of the double grating gate can be made close to that of the two-dimensional electron layer, whereby the radiation efficiency of terahertz electromagnetic waves can be increased. Further, reducing the thickness of the gate electrode to a possible extent (to be equal to or less than the distance between the gate electrode and the two-dimensional electron layer) is important for improving emissivity.

In a case where the double-grating-type gate electrode is formed through, for example, a process of etching a second two-dimensional electron layer layered on the two-dimensional electron layer within the semiconductor heterojunction structure, the thickness of the electrode can be reduced to the maximum degree, and the conductivity of the electrode can be reduced to the same level as that of the two-dimensional electron layer. Therefore, the plasma frequency of the double-grating-type gate can be made close to that of the two-dimensional electron layer, whereby the radiation efficiency can be improved. In addition, since the conductivity of the second two-dimensional electron layer can be controlled by the gate bias potential, the plasma frequency of the double-grating-type gate can be variably controlled. Accordingly, the radiation efficiency can be improved further in accordance with the frequency of electromagnetic waves to be radiated.

After the element body is fabricated in the manner as described above, the semiinsulating bulk layer (substrate) is selectively etched or polished from the reverse face, and a clad material having a low dielectric constant is charged into (to fill) a resultant space. This clad material covers not only the left and right sides shown in FIG. 1, but also the near and far sides in the drawing, so as to cover the periphery of the semiinsulating bulk layer. In a case where the side surfaces of the semiinsulating bulk layer are covered with a clad layer which is lower in dielectric constant than the semiinsulating bulk layer, the degree of confinement of electromagnetic waves within a vertical resonator increases, and the radiation loss can be reduced, whereby the conversion efficiency can be improved further.

In the final step, a transparent metal such as ITO (indium tin oxide) is formed on the lower surface of the semiinsulating bulk layer through film forming. The transparent metal is transparent to light ranging from visible light to near-infrared light, and has a conductivity comparable to those of metals and therefore exhibits a reflection property to terahertz electromagnetic waves. Thus, it is possible to form a transparent metal mirror through which light wave input passes and which functions as a mirror for terahertz electromagnetic waves.

Next, operation of a terahertz electromagnetic wave radiation element completed as described above will be described. Two linearly polarized coherent light waves (in FIG. 1, the direction of the electric field vector is shown by E), the frequencies of which are close to each other with a difference of the terahertz order, are caused to enter from the lower surface of the transparent metal mirror as seed light. In FIG. 1, the wave number vectors of the two light waves are represented by k1 and k2, respectively, and their frequencies are represented by f0 and f0+Δf, respectively. Optically excited electrons can be generated through use of two light waves whose photon energies are greater than the band gap energy of an electron traveling layer which constitutes a two-dimensional plasmon but smaller than the band gap energies of the other semiconductor epitaxial layers and the semiconductor substrate. The optically excited electrons are accelerated by means of the gradient of the conduction band potential itself, and are injected into a two-dimensional plasmon region with the difference frequency component Δf. The two-dimensional plasmon is excited by the difference frequency component Δf of the optically excited electrons. Thus, in the two-dimensional electron region which is discretized to correspond to the double gate grating, plasmon resonance is excited by the difference frequency component Δf. Plasmon resonance in a single two-dimensional electron region serves as an excitation source, which is coherently excited in the two-dimensional plane at the discrete cycle. This cyclic structure itself achieves the conversion to the radiation electromagnetic wave mode. However, it is known that, in the vicinity of the plasma frequency determined from the periodicity and electron density of the cyclic two-dimensional electron layer, the transmission/reflection characteristics of this two-dimensional electron layer have poles, many of which cause a decrease in transmissivity.

Meanwhile, since the two-dimensional electron layer has a reflection property, for radiation electromagnetic waves, a resonator is formed in the vertical direction between the two-dimensional electron layer and the transparent metal mirror newly provided. When the frequency of a radiation electromagnetic wave matches the standing wave condition of the resonator; i.e., when the resonator length coincides with (2n+1)/4 (where n is an integer) times the wavelength of an electromagnetic wave (in the terahertz band) to be radiated, the reflection component of the electromagnetic wave is superimposed on the electromagnetic wave component within the resonator. Since the conduction band of the two-dimensional plasmon is split to sub-bands, the reflected terahertz electromagnetic wave having reached the plasmon region can directly excite the two-dimensional plasmon through inter-sub-band absorption. This leads to further excitation of plasma resonance, and causes positive feedback of plasma resonance→electromagnetic wave radiation.

Since the resonator length of the vertical resonator formed between the two-dimensional electron layer and the transparent metal mirror is fixed by the thickness of the semiinsulating semiconductor bulk layer, the resonance frequency is fixed within a frequency range in which the dielectric constant is constant. However, since the reflectance of the two-dimensional electron layer is not sufficiently high, the Q value of the resonator (determined by the reflectance of the transparent electrode mirror and the reflectance of the two-dimensional electron layer) is not high. Therefore, the effect of intensifying radiation electromagnetic waves can be obtained in a relatively wide range in the vicinity of the plasma frequency.

Due to the presence of the double-grating-type gate electrode, the plasma frequency is specified, because the double-grating-type gate electrode itself has cyclic electrode regions having high conductivity. When this plasma frequency becomes approximately equal to the plasma frequency of the two-dimensional electron layer, in a band in the vicinity of and lower than the plasma frequency, the energy of electromagnetic wave passing through this region is amplified upon receipt of energy from the two-dimensional electron plasmon (the theory of S. A. Mikhailov).

By means of determining the resonance frequency of the vertical resonator and the plasma frequencies of the two-dimensional electron layer and the double-grating-type gate such that they generally coincide with one another or they are close to one another, a high electromagnetic-wave radiation efficiency can be realized over a relatively wide frequency band centered at the plasma frequency. In FIG. 1, the wave number vector of the radiated electromagnetic wave is represented by $\Delta k$.

Further, by means of applying a constant DC bias potential between the source electrode and the drain electrode, uniform DC-drift traveling of two-dimensional electrons can be induced in the two-dimensional electron layer.

Figure 2:
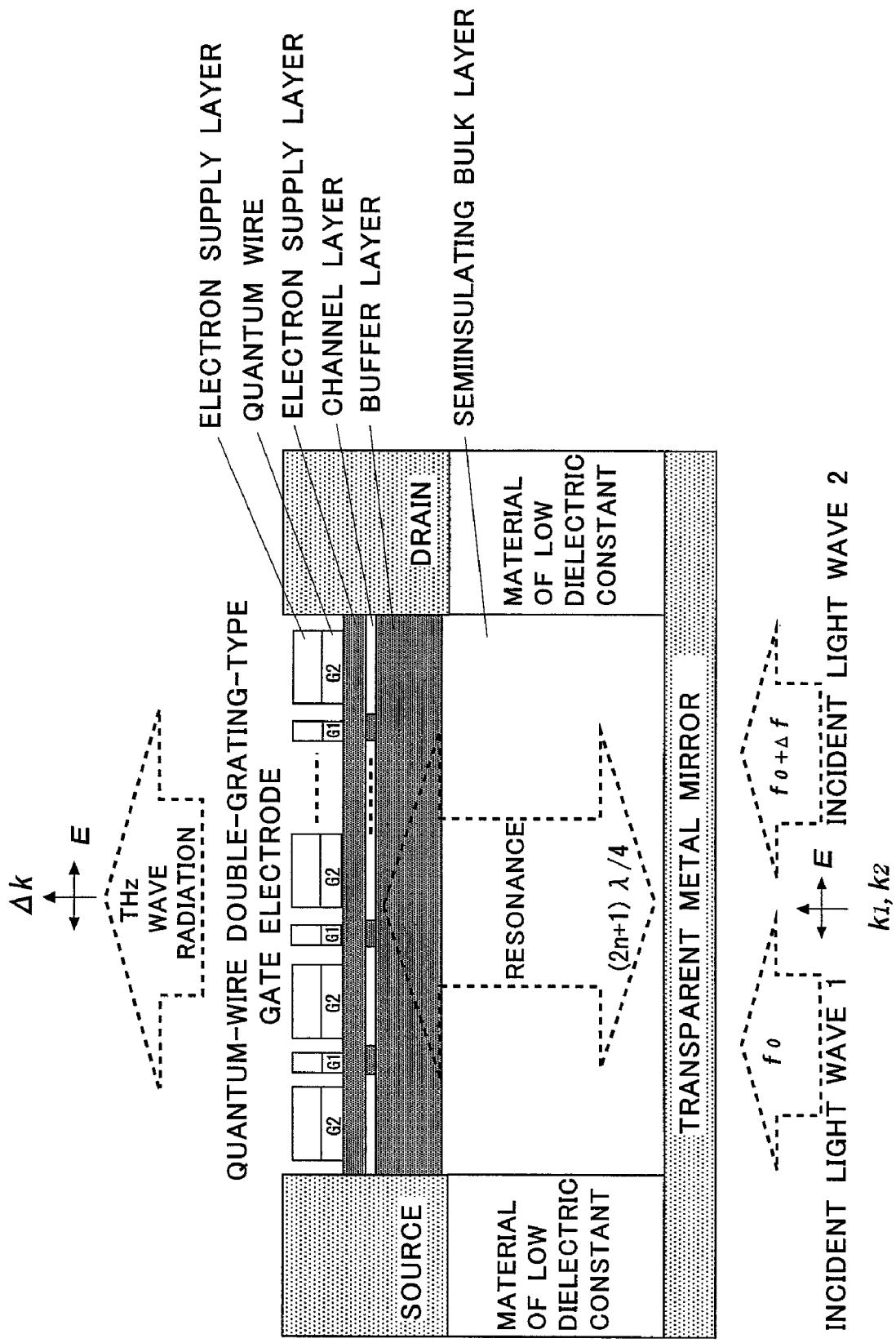
FIG. 2 is a cross sectional view showing a second example structure of the terahertz electromagnetic wave radiation element which embodies the present invention, in which the gate electrode is formed by quantum wires.

FIG. 2 is a cross sectional view showing a second example structure of the terahertz electromagnetic wave radiation element which embodies the present invention, in which the gate electrode is formed by quantum wires. The structure shown in FIG. 2 differs from that of the first example in the structure of the gate electrode. Through application of biases to quantum wires G1 and G2, the quantity of electrons supplied from the electron supply layer formed thereabove can be adjusted. Therefore, the electron densities in the quantum wires can be controlled so as to control their conductivities (proportional to the electron densities). Since the frequency at which the electromagnetic-wave radiation efficiency becomes maximum changes in accordance with the plasma frequency of the double-grating-type gate electrode, band broadening can be achieved by means of forming the gate electrode by use of quantum wires to thereby enable control of the conductivity of the electrode.

EXAMPLE 1

A specific structural example of the terahertz electromagnetic wave radiation element shown in FIG. 1 will be illustrated. Semiinsulating GaAs (gallium arsenide) is used as a semiconductor bulk layer, and a dielectric material which is lower in dielectric constant than GaAs, such as $Si_3N_4$ (silicon nitride), BCB (benzocyclobuten), or polyimide, is used as a clad layer. The semiconductor heterojunction structure is formed through a process of forming a buffer layer on the semiconductor bulk layer by use of, for example, intrinsic GaAs having a wide band gap, forming an electron traveling layer (channel) thereon by use of intrinsic InGaAs having a narrow band gap, and forming a layer of n-type InGaP having a wide band gap thereon. This n-type InGaP layer is a n-type semiconductor containing an excessive amount of electrons, and plays a role of supplying electrons to the electron traveling layer. This is the same mechanism as in ordinary HEMTs (high electron mobility transistors). An ohmic junction (non-diode junction) must be formed on the electron supply layer by means of metal-semiconductor junction so as to form a source electrode (metal) and a drain electrode (metal). Therefore, a strong n-type n+GaAs layer or the like is deposited, and electrodes of metal (e.g., Au or Pt) are further deposited so as to form respective ohmic junctions. Since the gate electrode above the channel must be insulated, the n+GaAs layer in this region is removed through recess etching, and the gate electrode is formed through deposition of Ti—Pt—Au or molybdenum.

The grating width of the first grating gate electrode of the double-grating-type gate electrode is set to the submicron order, the distance between the first grating gate electrode and the second grating gate electrode is set to the submicron order or less, and the grating width of the second grating gate electrode is set to the micron order or the submicron order. Further, the electron density of the two-dimensional electron layer immediately below the first grating gate electrode can be set to $10^{11}/cm^2$ to $10^{13}/cm^2$ by means of controlling the bias potential of the first grating gate electrode of the double-grating-type gate electrode, and the electron density of the two-dimensional electron layer immediately below the second grating gate electrode can be set to a considerably high level as in semi-metal or a considerably low level as in semi-insulator, by means of controlling the bias potential of the second grating gate electrode of the double-grating-type gate electrode.

EXAMPLE 2

A structural example different from Example 1 of the terahertz electromagnetic wave radiation element shown in FIG. 1 will be illustrated. The semiconductor heterojunction structure can be formed by use of an InP-based heterojunction structure, the semiconductor bulk layer can be formed by use of semiinsulating InP (indium phosphide), and the clad layer can be formed by use of a dielectric material which is lower in dielectric constant than InP, such as $Si_3N_4$ (silicon nitride), BCB (benzocyclobuten), or polyimide. The semiconductor heterojunction structure is formed through a process of forming a buffer layer on the semiconductor bulk layer by use of, for example, intrinsic InAlAs having a wide band gap, forming an electron traveling layer (channel) thereon by use of intrinsic InGaAs having a narrow band gap, and forming thereon a layer of InAlAs in which Si is δ-doped as a donor (doped only in a limited small region in the thickness direction) and which has a wide band gap. This Si-δ-doped InAlAs layer is a n-type semiconductor containing an excessive amount of electrons, and plays a role of supplying electrons to the electron traveling layer. This is the same mechanism as in ordinary HEMTs (high electron mobility transistors). An ohmic junction (non-diode junction) must be formed on the electron supply layer by means of metal-semiconductor junction so as to form a source electrode (metal) and a drain electrode (metal). Therefore, a strong n-type n+GaAs layer or the like is deposited, and electrodes of metal (e.g., Au or Pt) are further deposited so as to form respective ohmic junctions. The gate electrode above the channel must be insulated, the n+GaAs layer in this region is removed through recess etching, and the gate electrode is formed through deposition of Ti—Pt—Au or molybdenum.

EXAMPLE 3

There will be described the results of a test in which the electron density of the two-dimensional electron layer immediately below the gate gratings was modulated at the cycle of the gate gratings.

The threshold gate bias at which an electron is inducted in the channel of the electron traveling layer is represented by Vth. For example, in the case of an InP-based device (see Example 2), when the potential of the gate grating A is set to, for example, Vth+0.3 V, and the potential of the gate grating B is set to a higher level; for example, Vth+1.0 V, the channel immediately below the gate grating A has a two-dimensional electron density of $10^{11}$ to $10^{12}$ $cm^{-2}$, and the channel immediately below the gate grating B has a high electron density of $10^{14}$ cm$^{-2}$ or higher as in semi-metal. Meanwhile, when the potential of the gate grating B is set to a level lower than that of the gate grating A; for example, Vth−0.2 V, the channel immediately below the gate grating B has a low electron density of $10^9$ cm$^{-2}$ or lower as in semi-insulator.

In a two-dimensional electron region immediately below a single grating A, electron plasma is resonance-excited at a frequency peculiar to the electron density and size; i.e. the gate length (the interval between that region and regions of different electron density on opposite sides) of that region. In a case where the gate length is set to the order of submicron and the electron density is set to about $10^{12}$ cm$^{-2}$ in the semiconductor heterojunction material system, the plasma resonance frequency reaches the terahertz band. In the case of a photo mixer, when the frequency difference between two light waves with which the photo mixer is irradiated is set to the plasma resonance frequency, plasma resonance can be excited in the difference frequency terahertz band. This serves as a source of vibration. In this state, plasma resonance is individually excited in discrete regions immediately below individual gratings A. Notably, if only a single region is provided, electromagnetic wave radiation does not occur due to the plasma resonance, because the wavelength of plasma resonance waves is on the order of the gate length (submicron), and is considerably smaller than the wavelength (several tens of microns) of terahertz electromagnetic waves which propagate in the air.

Since the gratings A and B are provided alternately and repeatedly, plasma resonance occurs in the discrete regions. By virtue of this cyclic structure; in other words, a grating-like structure in which the electron density is modulated with the cycle of the gate grating, the electron plasma is also resonated at a wavelength corresponding to that cycle. In this case, plasma resonance waves in the discrete regions couple together, and produce a synchronized large vibration as a whole. When this region is wide enough such that the size of the region becomes approximately equal to the wavelength of electromagnetic waves which propagate in the air, electromagnetic wave radiation occurs in the direction perpendicular to this plasma vibration. That is, the plasma vibration of non-radiation mode is converted to radiation-mode electromagnetic waves. The plasma frequency fp determined by this cyclic structure is determined by an equation fp=vp/λ where vp represents a phase velocity depending on the electron density, provided that the above-mentioned cycle or period (the distance of a pair of the gratings A and B) is set to n times the wavelength λ, where n is an integer. The plasma frequency in the region immediately below the grating A naturally differs from that in the region immediately below the grating B. By means of setting the plasma frequency in the region immediately below the grating A to fall within the terahertz band and setting the plasma frequency in the region immediately below the grating B to greatly shift from the terahertz band, the plasma resonance immediately below the grating A serves as a seed, and radiation of an electromagnetic wave of that frequency can be attained. The cycle of the gratings A and B is determined such that the plasma frequency can be set to a desired range. Notably, the relation between the plasma frequency and the periodicity and the electron density is described in Non-Patent Document 4.

EXAMPLE 4

Figure 3:
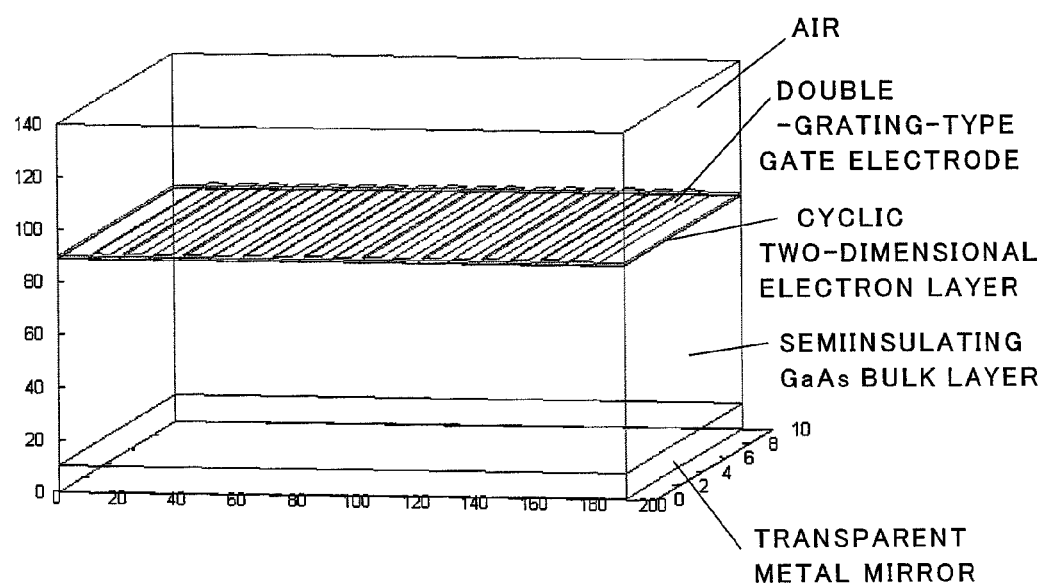
FIG. 3 is a bird's-eye view the structure of FIG. 1 simplified for numerical analysis.
Figure 4:
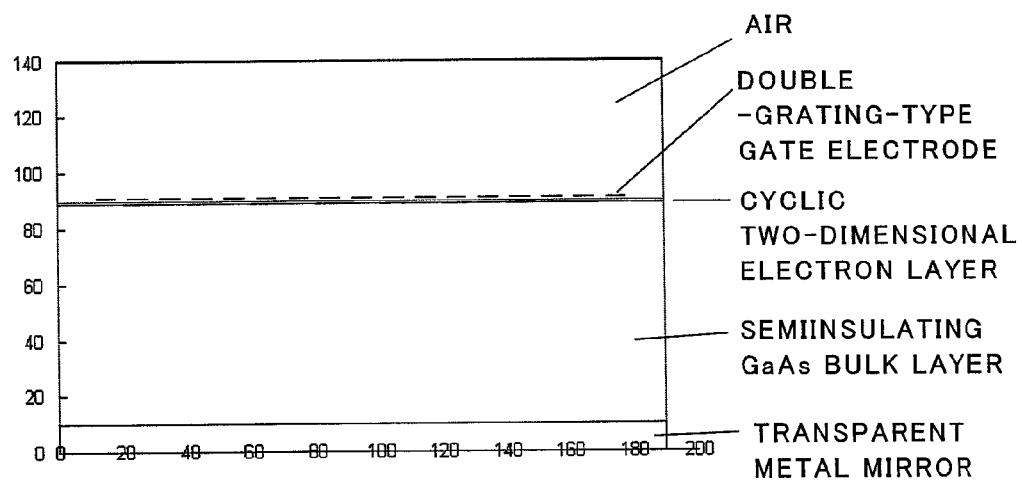
FIG. 4 is a cross sectional view of the structure shown in FIG. 3.

Hereinbelow, the effect of improving the terahertz-band electromagnetic wave conversion efficiency/radiation efficiency of the terahertz electromagnetic wave radiation element illustrated in FIG. 1 will be shown, while use of a specific structure and materials is assumed. FIG. 3 is a bird's-eye view of the structure of FIG. 1 simplified for numerical analysis. FIG. 4 is a sectional view thereof. Here, for approximation, the buffer layer and the electron supply layer are assumed to have the same properties (dielectric constant and conductivity) as the semiinsulating bulk layer. Further, a numerical scale shown in a lower portion of the drawing shows a coordinate value indicating each portion of a region for which numerical analysis is to be performed and which is divided in a mesh pattern, wherein the location of each portion is represented by the mesh number.

The electron density of the two-dimensional electron layer as shown in the drawing is controlled such that intermediate density regions, each of which has an electron density of $10^{12}$ cm$^{-2}$ and a width of 0.1 microns, and high density regions, each of which has an electron density of $10^{18}$ cm$^{-2}$ (as high as that of metal) and a width of 1.9 microns are formed alternately over a distance corresponding to 9 cycles. A gate electrode which is equal in conductivity to the intermediate density two-dimensional electron layer is periodically formed thereon to a thickness of 0.1 microns. An air layer is present above the gate electrode, and a semiinsulating GaAs bulk layer is provided below the two-dimensional electron layer. A metal mirror is provided on the lower surface of the bulk layer, whereby an electrical condition of complete reflection is assumed. The number of cycles must be selected to satisfy the requirements shown in Example 3, and must intrinsically be set to several tens to several hundreds. However, even when the grating A contains 9 regions and the grating B contains 10 regions as in the illustrated example, the results of analysis on the electromagnetic wave radiation property are sufficiently effective to show the dependency on the structure.

Under the theory of S. A. Mikhailov (see Non-Patent Document 4), the plasma frequency of the intermediate density two-dimensional electron region becomes about 3.4 THz. The resonator length of the vertical resonator formed between the two-dimensional electron layer and the metal mirror is set to the ¼ wavelength of this plasma frequency of 3.4 THz, with the relative dielectric constant of GaAs being considered to be 13.1. Further, the conductivity of the electrode is set in accordance with the theory of S. A. Mikhailov (see Non-Patent Document 4) such that the plasma frequency of the double-grating-type gate electrode coincides with 3.4 THz.

For the case where plasma resonance is excited in the cyclic intermediate density two-dimensional electron region, numerical analysis is performed on conversion of plasma resonance waves to radiation mode electromagnetic waves and radiation power of electromagnetic waves to the air region above the element top surface. The analysis is performed by exciting the cyclic intermediate density two-dimensional electron region with an impulse current source and obtaining the frequency spectral intensity distribution of the resultant electric field component at specific coordinate points in the semiinsulating bulk layer and the air region. The x axis represents a direction from the source electrode to the drain direction, and the z axis represents a vertical direction from the metal mirror surface to the top surface. The plasma resonance wave is a longitudinal vibration wave propagating in the x-axis direction, and the radiation electromagnetic wave is a plane wave whose electric field appears as an x-axis component and which propagates in the z-axis direction. Therefore, the x component of the electric field is obtained.

Figure 5:
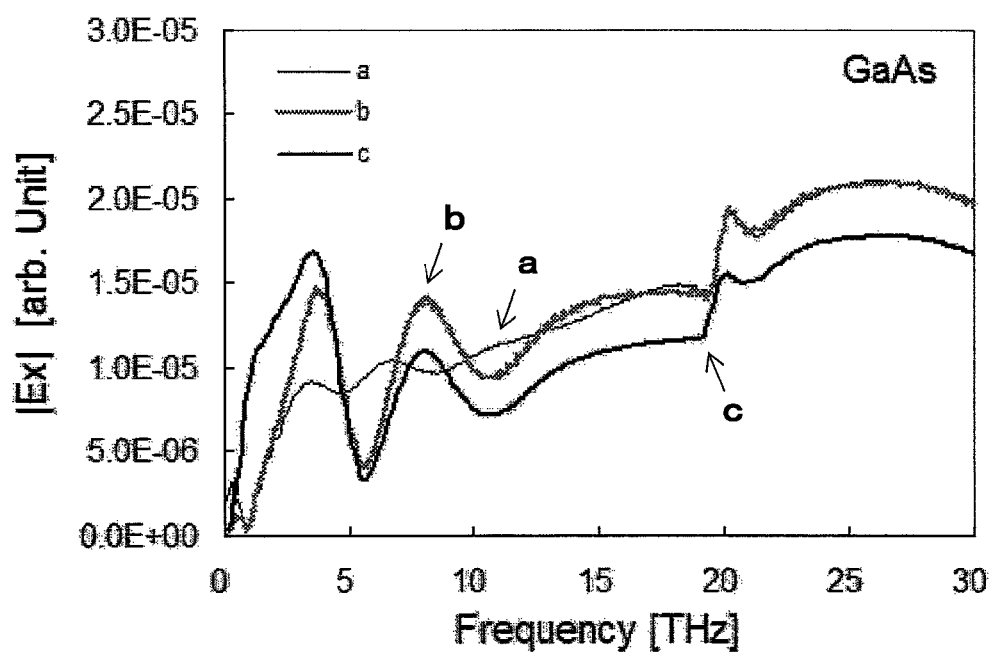
FIG. 5 is a graph showing the spectral intensity distribution of the electric field x-axis component at a point within the semiinsulating GaAs bulk layer located at the x-axis center and 0.4 microns below the two-dimensional electron layer, for the terahertz electromagnetic wave radiation element having the first example structure.
Figure 6:
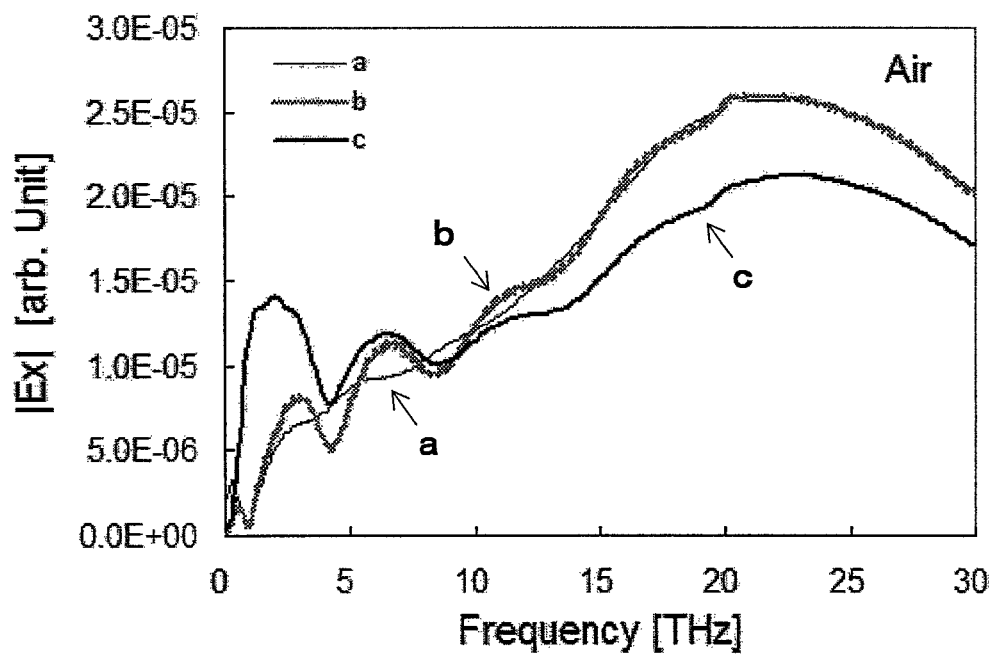
FIG. 6 is a graph showing the spectral intensity distribution of the electric field x-axis component at a point within the air layer located at the x-axis center and 0.4 microns above the two-dimensional electron layer, for the terahertz electromagnetic wave radiation element having the first example structure.

An electromagnetic wave absorbing boundary condition is set for the entire outer periphery of this structure, the progress of propagation of an electromagnetic wave with time is numerically analyzed by use of a time-domain finite-difference method, and its time-response waveform is subjected to Fourier transformation to thereby calculate the frequency spectrum. FIGS. 5 and 6 show the results of the analysis. A broad and large peak of the electric field component which appears at and above 10 THz in each of FIGS. 5 and 6 is an error (convergence error of a vibrating solution) involved in the numerical analysis, and therefore, the broad and large peak is ignored here.

FIG. 5 shows the spectral intensity distribution of the electric field x-axis component at a point which is located at the center of the semiinsulating GaAs bulk layer with respect to the x-axis direction and 0.4 microns below the two-dimensional electron layer. Curve a shows the result of analysis performed for a structure in which the metal mirror on the reverse surface and the double-grating-type gate electrode are removed. Curve b shows the result of analysis performed for a structure in which the metal mirror on the reverse surface is provided and the double-grating-type gate electrode is removed. Curve c shows the result of analysis performed for a structure according to the present invention in which the metal mirror on the reverse surface and the double-grating-type gate electrode are provided. From the analysis results, it is understood that provision of the metal mirror causes generation of resonance whose base frequency is 3.4 THz. Further, as can be see from FIG. 5, as a result of provision of the double-grating-type gate electrode, the electric field component increases in the vicinity of the plasma frequency of 3.4 THz.

FIG. 6 shows the spectral intensity distribution of the electric field x-axis component at a point which is located at the center of the air layer with respect to the x-axis direction and 0.4 microns above the two-dimensional electron layer. The same trend as in FIG. 5 can be seen. However, in particular, as a result of provision of the double-grating-type gate electrode, the effect of increasing the electric field component can be seen in a wide frequency range on the lower-frequency side of the plasma frequency of 3.4 THz.

It is understood that in the frequency range lower than the vicinity of 5 THz, an increase in the electric field component is obtained not only in the semiinsulating GaAs bulk layer but also in the air layer, and an electromagnetic-wave radiation gain is attained. Although attainment of gain itself is apparent from the theory of S. A. Mikhailov (see Non-Patent Document 4), in the present invention, through introduction of a vertical resonator structure, a large gain which has never before been attained and a broader frequency characteristic can be attained.

EXAMPLE 5

Next, there will be shown the effect of improving the terahertz-band electromagnetic wave conversion efficiency/radiation efficiency of the second example of the terahertz electromagnetic wave radiation element illustrated in FIG. 2. In the second example, the electron density of the two-dimensional electron layer as shown in FIGS. 3 and 4 is controlled such that intermediate density regions each of which has an electron density of $10^{12}$ cm$^{-2}$ and a width of 0.1 microns and low density regions each of which has an electron density of $10^7$ cm$^{-2}$ (as low as that of the semiinsulating GaAs bulk layer) and a width of 1.9 microns are formed alternately over a distance corresponding to 9 cycles. A gate electrode which is equal in conductivity to the intermediate density two-dimensional electron layer is periodically formed thereon to a thickness of 0.1 microns. An air layer is present above the gate electrode, and a semiinsulating GaAs bulk layer is provided below the two-dimensional electron layer. A metal mirror is provided on the lower surface of the bulk layer, whereby an electrical condition of complete reflection is assumed. Under the theory of S. A. Mikhailov, the plasma frequency of the intermediate density two-dimensional electron region becomes about 3.4 THz. The resonator length of the vertical resonator formed between the two-dimensional electron layer and the metal mirror is set to the ¼ wavelength of this plasma frequency of 3.4 THz, with the relative dielectric constant of GaAs being considered to be 13.1. Further, the conductivity of the electrode is set in accordance with the theory of S. A. Mikhailov such that the plasma frequency of the double-grating-type gate electrode coincides with 3.4 THz.

For the case where plasma resonance is excited in the cyclic intermediate density two-dimensional electron region, numerical analysis is performed on conversion of plasma resonance waves to radiation mode electromagnetic waves and radiation power of electromagnetic waves to the air region above the element top surface. The analysis is performed by exciting the cyclic intermediate density two-dimensional electron region with an impulse current source and obtaining the frequency spectral intensity distribution of the resultant electric field component at specific coordinate points in the semiinsulating bulk layer and the air region. The x axis represents a direction from the source electrode to the drain direction, and the z axis represents a vertical direction from the metal mirror surface to the top surface. The plasma resonance wave is a longitudinal vibration wave propagating in the x-axis direction, and the radiation electromagnetic wave is a plane wave whose electric field appears as an x-axis component and which propagate in the z-axis direction. Therefore, the x component of the electric field is obtained.

Figure 7:
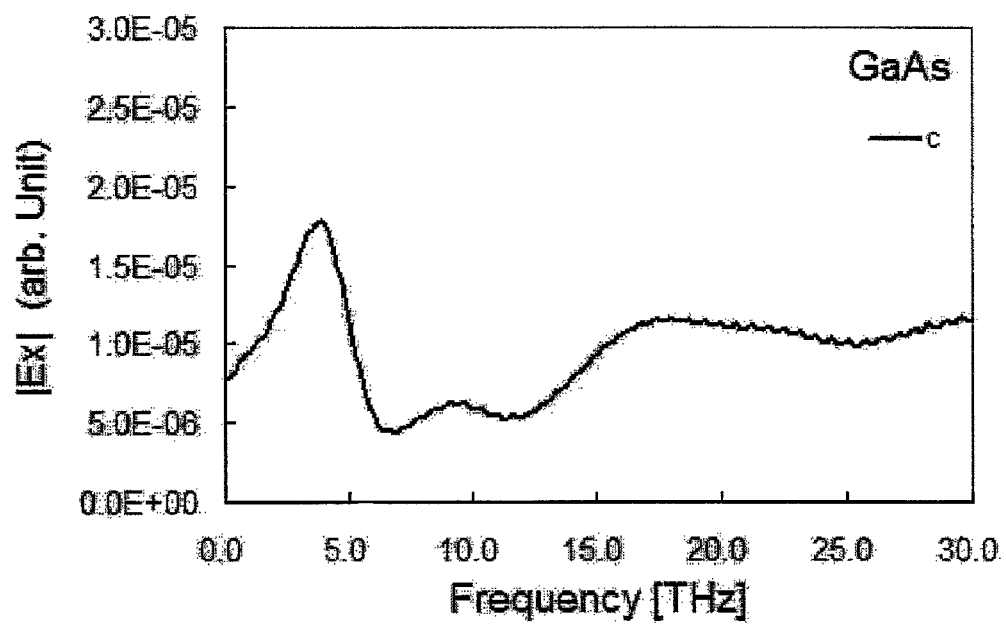
FIG. 7 is a graph showing the spectral intensity distribution of the electric field x-axis component at a point within the semiinsulating GaAs bulk layer located at the x-axis center and 0.4 microns below the two-dimensional electron layer, for the terahertz electromagnetic wave radiation element having the second example structure.
Figure 8:
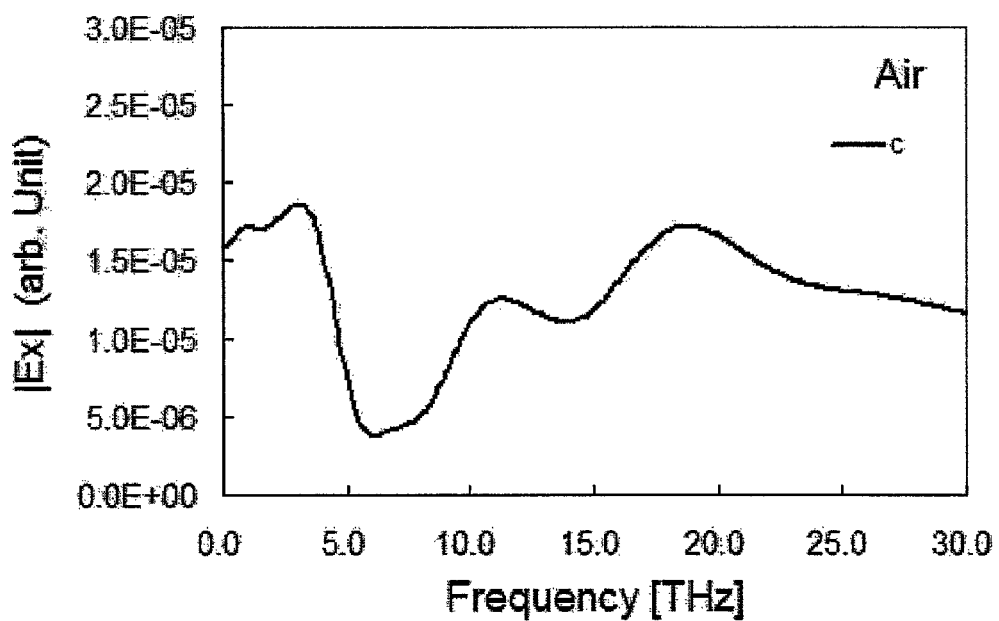
FIG. 8 is a graph showing the spectral intensity distribution of the electric field x-axis component at a point within the air layer located at the x-axis center and 0.4 microns above the two-dimensional electron layer, for the terahertz electromagnetic wave radiation element having the second example structure.

An electromagnetic wave absorbing boundary condition is set for the entire outer periphery of this structure, the progress of propagation of an electromagnetic wave with time is numerically analyzed by use of a time-domain finite-difference method, and its time-response waveform is subjected to Fourier transformation to thereby calculate the frequency spectrum. FIGS. 7 and 8 show the results of the analysis. As in the case of FIGS. 5 and 6, a broad and large peak of the electric field component which appears at and above 10 THz in each of FIGS. 7 and 8 is an error (convergence error of a vibrating solution) involved in the numerical analysis, and therefore, the broad and large peak is ignored here.

FIG. 7 shows the spectral intensity distribution of the electric field x-axis component at a point which is located at the center of the semiinsulating GaAs bulk layer with respect to the x-axis direction and 0.4 microns below the two-dimensional electron layer. The result of analysis indicated by symbol c in the legend of the drawing corresponds to the result of analysis shown by curve c in FIG. 5, and is the result of analysis performed for a structure according to the present invention in which the metal mirror on the reverse surface and the double-grating-type gate electrode are provided. From the analysis results, it is understood that provision of the metal mirror causes generation of resonance whose base frequency is 3.4 THz. Further, as a result of provision of the double-grating-type gate electrode, the effect of increasing the electric field component can be seen in a wide frequency range lower than the vicinity of the plasma frequency of 3.4 THz.

FIG. 8 shows the spectral intensity distribution of the electric field x-axis component at a point which is located at the center of the air layer with respect to the x-axis direction and 0.4 microns above the two-dimensional electron layer. The same trend as in FIG. 6 can be seen. However, in particular, as a result of provision of the double-grating-type gate electrode, the effect of increasing the electric field component can be seen in a wide frequency range on the lower-frequency side of the plasma frequency of 3.4 THz. In particular, when compared with the example of FIG. 6, through setting the electron density of the 1.9 micron-width cyclic regions of the cyclic two-dimensional electron layer to $10^7$ cm$^{-2}$, which is as low as that of the semiinsulating GaAs bulk layer, the plasma frequency of this region falls in a low frequency range not higher than 0.01 THz. Therefore, the effect of increasing the electric field component can be obtainer to a lower frequency range, as compared with the example of FIG. 6 in which the electron density is set to a high electron density as in semi-metal (accordingly, the plasma frequency of this region falls in a high frequency range not lower than 10 THz).

According to the present invention, through introduction of a vertical resonator structure, a large gain which has never before been attained and a wider frequency characteristic can be obtained.

The invention claimed is:

1. A terahertz electromagnetic wave radiation element which receives two coherent light waves, mixes them, and radiates a terahertz electromagnetic wave corresponding to the difference frequency thereof, the element comprising:
    a semiinsulating semiconductor bulk layer;
    a two-dimensional electron layer formed directly above the semiconductor bulk layer by a semiconductor heterojunction structure;
    a source electrode electrically connected to one side of the two-dimensional electron layer;
    a drain electrode electrically connected to another side of the two-dimensional electron layer opposite to the source electrode;
    a double gate electrode grating provided in the vicinity of an upper surface of the two-dimensional electron layer and parallel to the two-dimensional electron layer, two different dc bias potentials being able to be alternately set for the double gate electrode grating; and
    a transparent metal mirror provided in contact with a lower surface of the semiconductor bulk layer, formed into a film shape, functioning as a reflecting mirror in the terahertz band, and being transparent in the light wave band,
    wherein two light waves are caused to enter from a lower surface of the transparent metal mirror, and two different dc bias potentials are alternately applied to the double gate electrode grating so as to periodically modulate the electron density of the two-dimensional electron layer in accordance with the configuration of the double gate electrode grating.

2. A terahertz electromagnetic wave radiation element according to claim 1, wherein the double gate electrode grating is formed in the shape of a nested double grating.

3. A terahertz electromagnetic wave radiation element according to claim 1, wherein side surfaces of the semiconductor bulk layer are covered with a low dielectric-constant material which has a relative dielectric constant lower than that of the semiconductor bulk layer.

4. A terahertz electromagnetic wave radiation element according to claim 1, wherein a constant DC bias potential is applied between the source electrode and the drain electrode to thereby cause uniform DC drift traveling of two-dimensional electrons within the two-dimensional electron layer.

5. A terahertz electromagnetic wave radiation element according to claim 1, wherein the grating width of a first grating gate electrode of the double gate electrode grating is set to a width on the submicron order, and the distance between the first grating gate electrode and a second grating gate electrode adjacent to the first grating gate electrode is set to a submicron or less, and the grating width of the second grating gate electrode is set to a width on the micron or submicron order; and
    the electron density of the two-dimensional electron layer immediately below the first grating gate electrode is set to $10^{11}$/cm$^2$ to $10^{13}$/cm$^2$ by means of controlling the bias potential of the first grating gate electrode of the double gate electrode grating, and the electron density of the two-dimensional electron layer immediately below the second grating gate electrode is set to a considerably high level as in semi-metal or a considerably low level as in semi-insulator by means of controlling the bias potential of the second grating gate electrode of the double gate electrode grating.

6. A terahertz electromagnetic wave radiation element according to claim 5, wherein the double gate electrode grating is formed by a material having a conductivity approximately equal to that of the two-dimensional electron layer immediately below the first grating gate electrode.

7. A terahertz electromagnetic wave radiation element according to claim 6, wherein the thickness of the double gate electrode grating is smaller than the distance between the double gate electrode grating and the two-dimensional electron layer.

8. A terahertz electromagnetic wave radiation element according to claim 7, wherein the double gate electrode grating is formed by etching a second two-dimensional electron layer layered on the two-dimensional electron layer in the semiconductor heterojunction structure, and the conductivity of the second two-dimensional electron layer can be controlled by a gate bias potential.

9. A terahertz electromagnetic wave radiation element according to claim 6, wherein the distance between the two-dimensional electron layer and the transparent metal mirror is set to $(2n+1)/4$ times the wavelength of a (terahertz band) electromagnetic wave to be radiated, where n is an integer.

10. A method of manufacturing a terahertz electromagnetic wave radiation element which receives two coherent light waves, mixes them, and radiates a terahertz electromagnetic wave corresponding to the difference frequency thereof, the method comprising:
    forming a two-dimensional electron layer formed directly above a substrate serving as a semiconductor bulk layer by a semiconductor heterojunction structure, a source electrode electrically connected to one side of the two-dimensional electron layer, and a drain electrode electrically connected to another side of the two-dimensional electron layer opposite to the source electrode;
    forming a double gate electrode grating in the vicinity of an upper surface of the two-dimensional electron layer and parallel to the two-dimensional electron layer, two different dc bias potentials being able to be alternately set for the double gate electrode grating; and
    forming a transparent metal mirror in contact with a lower surface of the semiconductor bulk layer, the metal mirror being formed into a film shape, functioning as a reflecting mirror in the terahertz band, and being transparent in the light wave band.

11. A method of manufacturing a terahertz electromagnetic wave radiation element according to claim 10, wherein side surfaces of the semiconductor bulk layer are covered with a low dielectric-constant material which has a relative dielectric constant lower than that of the semiconductor bulk layer.

* * * * *